United States Patent [19]

DeVries

[11] 4,403,108

[45] Sep. 6, 1983

[54] MINIATURIZED BUS BAR WITH CAPACITORS AND ASSEMBLY TECHNIQUE

[75] Inventor: Donald H. DeVries, Mesa, Ariz.

[73] Assignee: Rogers Corporation, Rogers, Conn.

[21] Appl. No.: 249,686

[22] Filed: Mar. 31, 1981

[51] Int. Cl.³ .................. H01B 7/00; H01B 13/00
[52] U.S. Cl. ........................... 174/72 B; 29/854
[58] Field of Search ............ 174/68 B, 70 B, 72 B; 29/825, 854, 855, 856, 25.42; 361/303, 304, 306, 328, 329, 330

[56] References Cited

U.S. PATENT DOCUMENTS

| | | | |
|---|---|---|---|
| 4,001,150 | 1/1977 | Juna et al. | 204/181 R X |
| 4,236,038 | 11/1980 | Taylor | 174/72 B |
| 4,266,091 | 5/1981 | Fukuda | 174/72 B |

Primary Examiner—Laramie E. Askin
Attorney, Agent, or Firm—David S. Fishman

[57] ABSTRACT

Structure for and a method of construction of miniaturized bus bars are presented wherein the bus bar incorporates discrete high capacitive elements between a pair of bus bar conductors, the high capacitive elements being defined by wafers of material having a high dielectric constant coated with layers of conductive polymer. The conductive polymer is used to bind the chips between the bus bar conductors.

22 Claims, 3 Drawing Figures

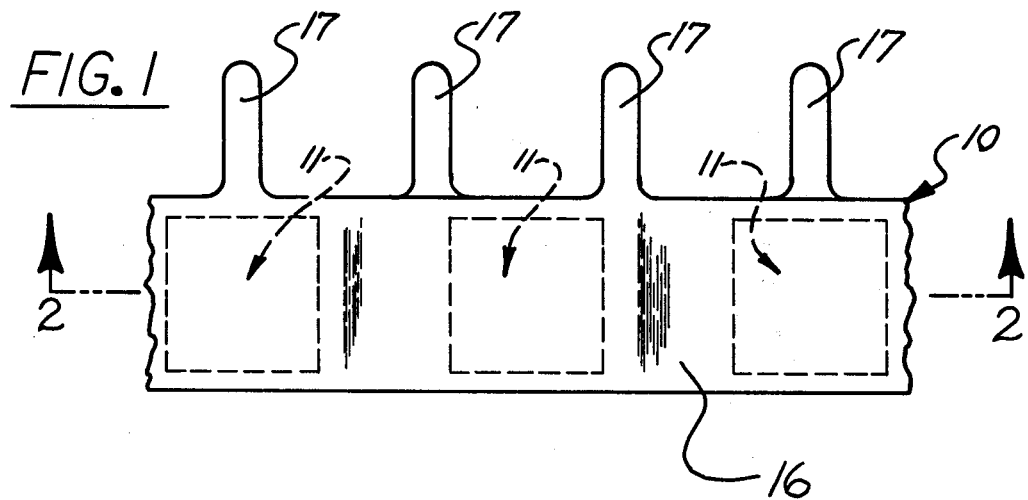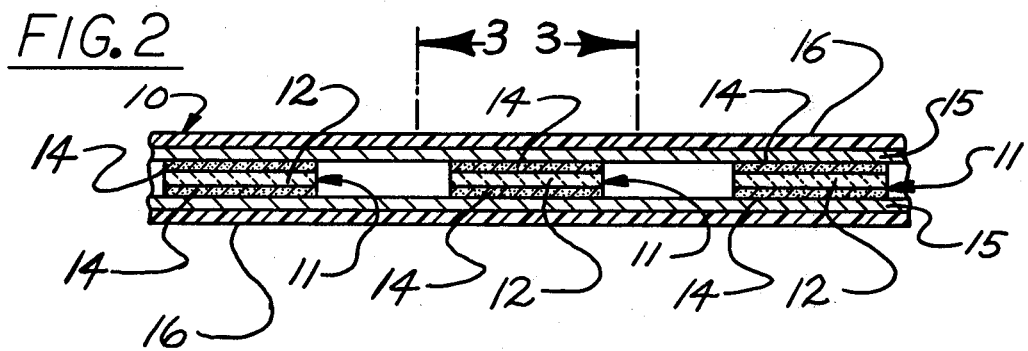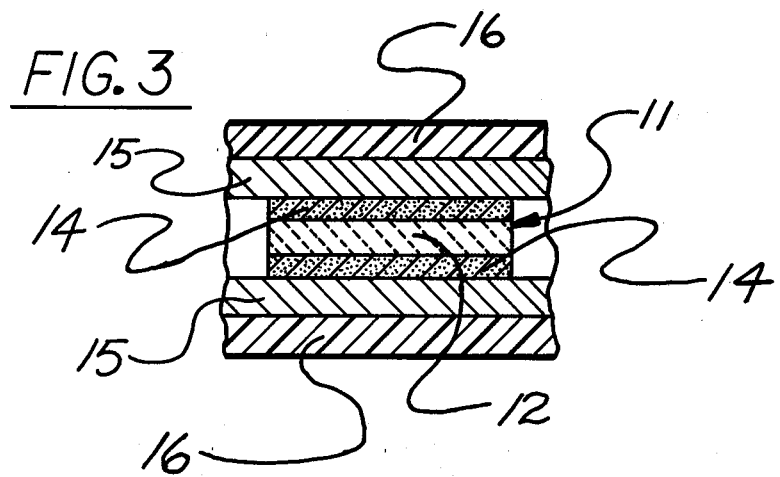

MINIATURIZED BUS BAR WITH CAPACITORS AND ASSEMBLY TECHNIQUE

BACKGROUND OF THE INVENTION

1. Field of the Invention

This invention relates to bus bars, especially relatively small or miniature bus bars. More particularly, this invention relates to multilayer bus bar assemblies, and the method of manufacture thereof, wherein the bus bar assembly incorporates capacitive elements between layers of bus conductors to provide high capacitance bus bars.

2. Description of the Prior Art

Conventional bus bars of relatively small or miniature size have been known in the art for a number of years. Such bus bar devices are used for power and/or signal distribution in many systems, such as, for example, computer back panels and integrated circuit systems. Such prior art multilayer bus bars comprise at least two conductive plates (usually in the form of elongated strips or bars of copper) separated by an insulating film. A typical prior art bus bar of this type may use copper conductors having a thickness of about 10 mils, and the overall dimensions of the bus bar may be formed about 0.019 to 0.120 inch thick, from about 0.0150 to 0.200 inch wide and range in length up to about 16 inches. Typically, the separating insulating layer is a plastic dielectric film such as the polyester material known as MYLAR. The MYLAR separator layer and the conductive plates are bonded together by an adhesive. Conventional prior art bus bars of this type have relatively low capacitance which results in the device being comparatively ineffective in attenuating high frequency noise. This high frequency noise is highly undesirable, especially when the bus bar is used for signal distribution.

One prior art approach to eliminating this noise problem involves connecting capacitors to the bus bar after the completion of the bus bar assembly. While this approach raised the capacitance and minimized the noise, it resulted in additional expense and time in manufacturing.

Another type of bus bar structure disclosed in the prior art involves disposing discrete high capacitive elements between a pair of bus conductors. These bus bars have the desired high capacitance. Examples of such high capacitance bus bars are disclosed in U.S. Pat. Nos. 4,236,038 and 4,236,046 and in patent application Ser. No. 950,266 filed Oct. 10, 1978, now U.S. Pat. No. 4,266,091 all of which are owned by the assignee of the present invention. The high capacitance elements utilized in those inventions are thin layers or chips of dielectric material, usually a ceramic with a high dielectric constant. The opposing surfaces of the chips are typically coated with a thin, integral and continuous film of conductive material and those conductive films are electrically connected to respective ones of the bus conductors.

SUMMARY OF THE INVENTION

The present invention provides novel apparatus for and method of construction of miniaturized bus bar assemblies.

In accordance with the present invention, capacitive elements are formed by coating the opposite faces of chips or wafers of a material having a high dielectric constant with a conductive polymer. A plurality of these capacitive elements are positioned between a pair of bus bar conductors to form a bus bar assembly having high internal capacitance. The conductive polymer coated on the opposing faces of the chips serves to mechanically bond the capacitive elements to the bus bar conductors, and to establish electrical connection between the bus conductors and the surfaces of the chips.

Accordingly, the present invention has among its objectives the provision of novel apparatus for and method of producing a miniaturized bus bar characterized by high capacitance between bus conductors.

BRIEF DESCRIPTION OF THE DRAWINGS

In the drawings, wherein like elements are numbered alike in the several FIGURES:

FIG. 1 is a partial top plan view of a bus bar of the present invention.

FIG. 2 is a cross-sectional side elevation view taken along line 2—2 of FIG. 1.

FIG. 3 is an enlarged detail of section 3—3 of FIG. 2.

DESCRIPTION OF THE PREFERRED EMBODIMENT

Referring to the several FIGURES which show the preferred embodiment of the present invention, a miniaturized bus bar is indicated generally at 10. Bus bar 10 includes a plurality of capacitive chips, indicated generally at 11 which are formed from a material such as barium titanate or equivalent ceramic material 12, which has a high dielectric constant. The ceramic material 12 is preferably in the form of thin flat chips but also may be in the form of "ribbons" of ceramic. The opposing sides or faces of these thin flat chips 12 are coated with a polymeric adhesive 14 which is inherently conductive; i.e., fillers such as silver flakes are not included in the adhesive. This adhesive is a conductive resin such as a polyester including unsaturated sulfonic ester, as disclosed in U.S. Pat. No. 4,001,150, polyacetylene, polysulfur nitride, TCNQ (7,7,8,8-tetracyanoquinodimethane salts) or any similar material. These resins may be doped with sodium or a halogen to enhance conductivity. Since the conductive adhesive 14 is spread over relatively large surface areas and in a thin coating, a "high" resistivity conductor can be tolerated. The maximum resistivity for the adhesive in accordance with the present invention is $10^3$ ohm/cm. In addition to being electrically conductive, the adhesive will flow or set on the application of heat to form a firm mechanical adhesive bond.

The conductive material 14 on each ceramic chip serves to define the plates of a capacitor, so that each chip constitutes a capacitor having a high dielectric constant, sandwiched between spaced electrically conductive plates 14.

In addition to defining the capacitor plates, the conductive polymeric material is also used as the adhesive to conductively bond the capacitive chips 11 between a pair of bus bar conductors 15 to form the final mechanical and electrical assembly. The bus bar conductors 15 have distribution prongs or fingers 17 for the distribution of power or signals as desired.

The outer surfaces of bus bar conductors 15 may be coated with an insulating plastic 16, or the entire unit may be encapsulated in such plastic.

The method of assembly of the structure of this invention is as follows:

1. Form capacitive elements having outer plates of conductive polymeric adhesive material
2. Position a plurality of these capacitive elements between a pair of bus bar conductors
3. Heat the assembly to set the polymeric adhesive material and bond the capacitive elements to the bus bar conductors.

As an alternative assembly technique, the conductive polymeric material could be applied to the opposed faces of conductor 15 at appropriately spaced stations in alignment with the positions where the ceramic chips are to be located. The ceramic chips, which would then be only the ceramic material 12, would then be placed on the polymeric material on one bus conductor 15; then the other conductor 15 would be placed on top of the chips, with the polymeric material on the second conductor in alignment with the upper surfaces of the chips; and then the assembly would be completed by application of heat to set the adhesive.

The bus bar conductors of the present invention are copper elements, which may be tin plated; and they are approximately 10 mils thick and range in width or height from about 0.150 to about 0.200 inch and range in length from about 2 to 16 inches, depending on the particular application for the bus bar. The ceramic material 12 from which the capacitive chips 11 or strip capacitors are formed has a high dielectric constant, for example a dielectric constant in excess of 8,000, and the thickness of the dielectric material may range from about 0.005 inch to about 0.015 inch and have opposed face surface dimensions in the range of from about 0.2 inch by 0.2 inch to about 0.2 inch by 3.0 inches for individual chips or may extend for the length of the bus bar assembly if in the form of ribbon capacitors.

While preferred embodiments have been shown and/or described, various modifications and substitutions may be made thereto without departing from the spirit and scope of the invention. Accordingly, it is to be understood that the present invention has been described by way of illustration and not limitation.

What is claimed is:

1. A high capacitance bus bar assembly comprising:
   a pair of spatially separated elongated bus bar conductors, said conductors having inwardly facing planar surfaces;
   at least a first wafer means, said wafer means being positioned between said conductors, said wafer means having two opposed planar surfaces which respectively face said conductor inwardly facing planar surfaces, said wafer means being comprised of a dielectric material; and
   at least two polymeric coat means, said coat means being free of conductive fillers, said coat means comprising a thin layer in intimate contact with respective of said planar surfaces of said wafer means, said coat means also being in intimate contact with the inwardly facing planar surfaces of said conductors which face said wafer means, said coat means having a low resistivity, said coat means bonding said opposed surfaces of said wafer means to respective ones of said conductor inwardly facing planar surfaces, said coat means being sufficiently thin to minimize the electrical resistance between said wafer means and said conductors.
2. The assembly of claim 1 wherein said polymeric coat means is comprised of an adhesive resin.
3. The assembly of claim 2 wherein said adhesive resin has a maximum resistivity of $10^3$ ohm/cm.
4. The assembly of claim 3 wherein said dielectric material possesses a dielectric constant in excess of 8,000.
5. The assembly of claim 4 wherein the thickness of said wafer means is in the range of 0.005 inch to 0.015 inch.
6. The assembly of claim 1 wherein said polymeric coat means is selected from the group of adhesives consisting of:
   polyester including unsaturated sulfonic ester;
   polyactylene;
   polysulfur nitride; and
   7,7,8,8-tetracyanoquinodimethane salts.
7. The assembly of claim 6 wherein said polyester resin has a maximum resistivity of $10^3$ ohm/cm.
8. The assembly of claim 7 wherein said dielectric material possesses a dielectric constant in excess of 8,000.
9. The assembly of claim 8 wherein the thickness of said wafer means is in the range of 0.005 inch to 0.015 inch.
10. The assembly of claim 1 wherein said dielectric material possesses a dielectric constant in excess of 8,000.
11. The assembly of claim 10 wherein the thickness of said wafer means is in the range of 0.005 inch to 0.015 inch.
12. A method of forming a high capacitance bus bar assembly comprising the steps of:
    choosing at least a first wafer with two opposed planar surfaces and comprising a dielectric material;
    selecting a polymeric adhesive with a low resistivity;
    applying a thin coating of said polymeric adhesive to said two opposed planar surfaces of said wafer;
    positioning said coated wafer between a pair of bus bar conductors; and
    curing said polymeric adhesive.
13. The method of claim 12 wherein the step of selecting the polymeric adhesive includes:
    picking an adhesive which has a maximum resistivity of $10^3$ ohm/cm.
14. The method of claim 13 wherein the step of choosing a first wafer includes:
    selecting a first wafer with a thickness in the range of between 0.005 and 0.015 inch.
15. The method of claim 13 further including the step of:
    choosing a wafer comprising a dielectric material with a dielectric constant above 8,000.
16. The method of claim 12 wherein the step of selecting the polymeric adhesive further includes the step of:
    selecting an adhesive from the group consisting of:
    polyester including unsaturated sulfonic ester;
    polyactylene;
    polysulfur nitride; and
    7,7,8,8-tetracyanoquinodimethane salts.
17. The method of claim 16 wherein the step of choosing a first wafer includes:
    selecting a first wafer with a thickness in the range of between 0.005 and 0.015 inch.
18. The method of claim 16 further including the step of:
    choosing a wafer comprising a dielectric material with a dielectric constant above 8,000.
19. The method of claim 12 wherein the step of choosing a first wafer includes:

selecting a first wafer with a thickness in the range of between 0.005 and 0.015 inch.

20. The method of claim 19 further including the step of:

choosing a wafer comprising a dielectric material with a dielectric constant above 8,000.

21. The method of claim 12 further including the step of:

choosing a wafer comprising a dielectric material with a dielectric constant above 8,000.

22. The method of claim 12 further including the steps of:

choosing a plurality of additional substantially identical dielectric wafers;

applying a thin coating of said polymeric adhesive to the opposed surfaces of each of said wafers;

positioning said plurality of wafers between said pair of bus bar conductors;

arranging said plurality of wafers in linear alignment with said first wafer and in spatially separated positions; and curing said polymeric adhesive on all wafers.

* * * * *

UNITED STATES PATENT OFFICE
CERTIFICATE OF CORRECTION

PATENT NO. : 4,403,108

DATED : Sep. 6, 1983

INVENTOR(S) : Donald H. DeVries

It is certified that error appears in the above-identified patent and that said Letters Patent are hereby corrected as shown below:

IN THE SPECIFICATION:

Column 1, line 25 "formed" should be --from--

Column 1, line 26 "0.0150" should be --0.150--

Signed and Sealed this

Ninth Day of April 1985

[SEAL]

Attest:

DONALD J. QUIGG

*Attesting Officer*     *Acting Commissioner of Patents and Trademarks*